United States Patent
Takamizawa et al.

(10) Patent No.: US 9,127,376 B2
(45) Date of Patent: Sep. 8, 2015

(54) METHOD FOR MANUFACTURING NITRIDE SEMICONDUCTOR SELF-SUPPORTING SUBSTRATE AND NITRIDE SEMICONDUCTOR SELF-SUPPORTING SUBSTRATE

(75) Inventors: Shoichi Takamizawa, Annaka (JP); Masataka Watanabe, Annaka (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 52 days.

(21) Appl. No.: 12/448,272

(22) PCT Filed: Dec. 5, 2007

(86) PCT No.: PCT/JP2007/001351
§ 371 (c)(1),
(2), (4) Date: Jun. 16, 2009

(87) PCT Pub. No.: WO2008/078401
PCT Pub. Date: Jul. 3, 2008

(65) Prior Publication Data
US 2010/0001376 A1    Jan. 7, 2010

(30) Foreign Application Priority Data
Dec. 26, 2006  (JP) ................. 2006-349756

(51) Int. Cl.
*C30B 29/40* (2006.01)
*C23C 16/448* (2006.01)
(Continued)

(52) U.S. Cl.
CPC ........... *C30B 29/406* (2013.01); *C23C 16/4488* (2013.01); *C30B 25/02* (2013.01);
(Continued)

(58) Field of Classification Search
CPC .... C30B 29/406; C30B 29/403; C30B 25/02; C23C 16/4488
USPC ............ 257/615, E21.108, 22, 76, 80, 94, 95, 257/103, 200; 438/492, 604, 341, 357, 363, 438/413, 416, 481; 117/84, 87, 97, 106, 117/108, 952
See application file for complete search history.

(56) References Cited

U.S. PATENT DOCUMENTS 4,686,682 A    8/1987   Haruta et al.
5,817,711 A *  10/1998  Kambe et al. ................. 524/501
(Continued)

FOREIGN PATENT DOCUMENTS

EP    1 041 610 A1    10/2000
JP    A-61-188983     8/1986
(Continued)

OTHER PUBLICATIONS

American Heritage Dictionary, Second College Edition. Houghton Mifflin. 1982. p. 257.*
(Continued)

*Primary Examiner* — Kyoung Lee
*Assistant Examiner* — Ratisha Mehta
(74) *Attorney, Agent, or Firm* — Oliff PLC

(57) ABSTRACT

The present invention provides a method for manufacturing a nitride semiconductor self-supporting substrate and a nitride semiconductor self-supporting substrate manufactured by this manufacturing method, the method including at least: a step of preparing a nitride semiconductor self-supporting substrate serving as a seed substrate; a step of epitaxially growing the same type of nitride semiconductor as the seed substrate on the seed substrate; and a step of slicing an epitaxially grown substrate subjected to the epitaxial growth into two pieces in parallel to an epitaxial growth surface. As a result, there is provided a method for manufacturing a large-diameter nitride semiconductor self-supporting substrate having an excellent crystal quality and small warp with good productivity at a low cost, etc.

17 Claims, 6 Drawing Sheets

(51) Int. Cl.
*C30B 25/02* (2006.01)
*H01L 21/02* (2006.01)

(52) U.S. Cl.
CPC ....... *C30B 29/403* (2013.01); *H01L 21/02005* (2013.01); *H01L 21/02008* (2013.01); *H01L 21/0254* (2013.01); *H01L 21/0262* (2013.01)

(56) References Cited

U.S. PATENT DOCUMENTS

| | | | |
|---|---|---|---|
| 6,413,627 B1 | | 7/2002 | Motoki et al. |
| 6,468,347 B1 * | | 10/2002 | Motoki et al. .................. 117/89 |
| 6,784,085 B2 * | | 8/2004 | Cuomo et al. ................ 438/604 |
| 7,018,912 B2 * | | 3/2006 | Kim et al. ..................... 438/504 |
| 7,387,677 B2 * | | 6/2008 | Dwilinski et al. ............... 117/73 |
| 2002/0028564 A1 | | 3/2002 | Motoki et al. |
| 2003/0157376 A1 * | | 8/2003 | Vaudo et al. .................. 428/698 |
| 2005/0056222 A1 | | 3/2005 | Melnik et al. |
| 2005/0103257 A1 * | | 5/2005 | Xu et al. ......................... 117/84 |
| 2005/0208687 A1 * | | 9/2005 | Kasai et al. ..................... 438/22 |
| 2005/0274976 A1 * | | 12/2005 | Shibata ......................... 257/189 |
| 2006/0011135 A1 * | | 1/2006 | Dmitriev et al. .............. 118/718 |
| 2006/0228819 A1 | | 10/2006 | Oshima |
| 2006/0228870 A1 * | | 10/2006 | Oshima ......................... 438/458 |
| 2006/0249135 A1 | | 11/2006 | Matsumoto |
| 2007/0072396 A1 * | | 3/2007 | Feltin et al. ................... 438/478 |
| 2008/0308812 A1 * | | 12/2008 | Kiyomi et al. ................... 257/76 |

FOREIGN PATENT DOCUMENTS

| | | | |
|---|---|---|---|
| JP | 08155948 A * | 6/1996 | |
| JP | A-2000-012900 | 1/2000 | |
| JP | A-2000-022212 | 1/2000 | |
| JP | A-2002-29897 | 1/2002 | |
| JP | A-2003-527296 | 9/2003 | |
| KR | 10-1999-0075107 | 10/1999 | |
| KR | 10-2002-0005974 | 1/2002 | |
| WO | WO 99/23693 | 5/1999 | |
| WO | WO 01/68955 A1 | 9/2001 | |
| WO | WO-01/68955 A1 | 9/2001 | |

OTHER PUBLICATIONS

Kelly et al., "Large Free-Standing GaN Substrates by Hydride Vapor Phase Epitaxy and Laser-Induced Liftoff," *Japanese Journal of Applied Physics*, vol. 38, Part 2, No. 3A, pp. L217-L219, Mar. 1, 1999.

Licznik et al., "Deposition of thick GaN layers by HVPE on the pressure grown GaN substrates," *Journal of Crystal Growth*, vol. 281, No. 1, pp. 38-46, Jul. 15, 2005.

European Search Report issued in corresponding European Application No. 07849786.4, mailed Apr. 23, 2010.

Sep. 4, 2012 Office Action issued in Taiwanese Patent Application No. 96147114 (with Partial English Translation).

Notification of Reasons of Refusal dated May 1, 2012 issued in Japanese Patent Application No. 2006-349756 (with translation).

Office Action dated Apr. 28, 2012 issued in Chinese Application No. 2007/80048302.4 (with translation).

Dec. 3, 2012 Office Action issued in Chinese Patent Application No. 200780048302.4 (with English Translation).

Aug. 8, 2011 Office Action issued in Chinese Patent Application No. 200780048302.4 (with translation).

Jun. 25, 2013 Office Action issued in Chinese Application No. 200780048302.4 (with Partial English Translation).

Jan. 8, 2014 Office Action issued in Chinese Patent Application No. 200780048302.4 (with partial English-language translation).

Jun. 10, 2014 Office Action issued in Korean Patent Application No. 10-2009-7013496 (with partial English-language translation).

Dec. 30, 2014 Office Action issued in Korean Patent Application No. 10-2009-7013496.

* cited by examiner (a)

(b)

(c)

PLANE TO BE SLICED (a)

(b)

METHOD FOR MANUFACTURING NITRIDE SEMICONDUCTOR SELF-SUPPORTING SUBSTRATE AND NITRIDE SEMICONDUCTOR SELF-SUPPORTING SUBSTRATE

TECHNICAL FIELD

The present invention relates to a self-supporting substrate of group III nitride semiconductor, GaN etc., and a manufacturing method thereof.

BACKGROUND ART

A group III nitride based compound semiconductor (a gallium nitride (GaN), an indium gallium nitride (InGaN), or a gallium aluminum nitride (GaAlN), etc.: which will be also simply referred to as a nitride semiconductor hereinafter) has recently started playing an important role as a material for a blue or ultraviolet light emitting diode (LED) or a laser diode (LD). Further, since a nitride semiconductor is superior in heat resistance or environment resistance or in high-frequency characteristics besides optical devices, electronic devices exploiting such characteristics have been positively developed.

However, bulk crystal growth of a nitride semiconductor is difficult, and a GaN self-supporting substrate is just utilized for, e.g., a laser diode application having no problem in cost in a limited way. A substrate for GaN growth which is currently extensively in practical use is a sapphire ($Al_2O_3$) substrate, and a method for epitaxial growth of GaN on a single-crystal sapphire substrate based on, e.g., a metalorganic vapor phase epitaxy method (an MOVPE method) is generally used.

In this case, since the sapphire substrate has a lattice constant different from that of GaN, a single-crystal film cannot be grown when GaN is directly epitaxially grown on the sapphire substrate. Therefore, a method for temporarily growing a buffer layer of AlN or GaN on the sapphire substrate at a low temperature, relaxing lattice distortion by using the buffer layer grown at a low temperature, and then growing GaN on this buffer layer is suggested (Japanese Patent Application Laid-open No. S61-188983)

However, even in growth of GaN using this buffer layer grown at a low temperature, the substrate after the epitaxial growth warps due to a difference in thermal expansion coefficient between the sapphire substrate and GaN, resulting in a problem of cracks or breakage.

Furthermore, warpage of the substrate after the epitaxial growth makes an exposure state of a fine pattern in photolithography uneven, thereby leading to a serious problem.

Moreover, in an illumination blue or ultraviolet LED that is demanded to be put to practical use in future, because the LED must emit light at a high luminance with a high current density, a low-cost GaN self-supporting substrate having a low dislocation density of a GaN light emitting layer and an excellent thermal conductivity with respect to the substrate is desired in terms of a light emission efficiency and a life duration.

Although a growth method for a GaN self-supporting substrate superior in crystallinity and productivity is demanded as explained above, a satisfactory countermeasure is yet to be provided.

To solve such a problem, an attempt of removing a sapphire substrate from a GaN epitaxially-grown substrate thickly grown on the sapphire substrate by a method of, e.g., etching or grinding to obtain a self-supporting substrate of GaN has been also made. When the self-supporting substrate of GaN is obtained, various problems caused due to a difference in lattice constant or a difference in thermal expansion coefficient in the epitaxial growth for forming a light emitting layer can be solved.

However, there still remains a problem that an inner strain of the GaN epitaxial layer due to a difference in thermal expansion coefficient between sapphire and GaN is locally relieved when the sapphire substrate is removed, and warp of the GaN substrate is thereby increased, thus breaking the substrate. A practical application of a method for thickly growing GaN on a sapphire substrate based on an HVPE method (Hydride Vapor Phase Epitaxy) and then applying a laser pulse to delaminate a GaN layer alone has been attempted (e.g., Jpn. J. Appl. Phys. Vol. 38 (1999) pt. 2, No. 3A, L217-219), but this method has a disadvantage that the substrate is apt to be cracked during a delamination process, thereby leading to a problem that a complicated processing is required to obtain a large GaN substrate with excellent reproducibility.

Additionally, a method for using a single crystal such as $LiAlO_2$ or ZnO whose lattice constant is close to that of GaN as a substrate in place of a sapphire substrate and growing GaN has been suggested. When such a substrate is used, delamination of the substrate becomes relatively easy, but heteroepitaxial growth is surely provided. Therefore, a buffer layer is required, and a practical application of a GaN substrate having excellent crystallinity still has a problem because of a difference in growth temperature or melting point of the substrate.

Further, a method for forming a mask of, e.g., $Si_3N_4$ having a window in a GaAs substrate, forming a low-temperature buffer layer, then epitaxially growing in a lateral direction based on the HVPE method to form an epitaxial layer having a low dislocation density, and removing the GaAs substrate by, e.g., etching to obtain a GaN self-supporting substrate has been carried out (Japanese Patent Application Laid-open No. 2000-12900 and Japanese Patent Application Laid-open No. 2000-22212). However, this method requires, e.g., a process of forming an $Si_3N_4$ mask having a window or a process of forming a low-temperature buffer layer. Furthermore, there is also a problem that the GaN self-supporting substrate greatly warps.

Moreover, since GaN epitaxial growth can be carried out at a relatively high speed in the HVPE method, an attempt of slicing a single-crystal ingot i.e., a boule formed by epitaxially growing an ultrathick film having a thickness of approximately 1 cm to 10 cm or above on a GaN self-supporting substrate based on such characteristics to obtain many substrates (sliced substrates) and polishing slice surfaces of the sliced substrates to acquire many GaN self-supporting substrates (which will be referred to as a boule method hereinafter) is also carried out (see, e.g., Japanese Patent Application Laid-open No. 2000-12900 and Japanese Patent Application Laid-open No. 2000-22212). However, according to this method, stably obtaining the GaN self-supporting substrate having a high crystal quality is difficult.

DISCLOSURE OF THE INVENTION

In view of the above-explained problems, it is a main object of the present invention to provide a method for manufacturing a nitride semiconductor self-supporting substrate having an excellent crystal quality, small warp, and a large diameter with good productivity at a low cost.

To achieve this object, the present invention provides a method for manufacturing a nitride semiconductor self-supporting substrate, including at least: a step of preparing a nitride semiconductor self-supporting substrate serving as a seed substrate; a step of epitaxially growing the same type of nitride semiconductor as the seed substrate on the seed substrate; and a step of slicing an epitaxially grown substrate subjected to the epitaxial growth into two pieces in parallel to an epitaxial growth surface, wherein two nitride semiconductor self-supporting substrates are manufactured from the single seed substrate.

When the method for manufacturing a nitride semiconductor self-supporting substrate including the above-explained steps to manufacture two nitride semiconductor self-supporting substrates from one seed substrate is adopted, since homoepitaxial growth that the same type of crystal is epitaxially grown on the nitride semiconductor self-supporting substrate serving as the seed substrate is provided, problems of warp, strain, breakage, etc. that can be observed in the heteroepitaxial growth do not occur, and a dislocation density of the epitaxial layer can be held down. As a result, crystallinity of each product, i.e., the nitride semiconductor self-supporting substrate obtained from the epitaxial layer side by slicing into two pieces can have a high quality.

Further, a complicated step, e.g., forming a mask having a complicated shape by using a different types of material is not provided, and the nitride semiconductor self-supporting substrate can be manufactured with excellent productivity at a low cost.

Furthermore, since epitaxial growth of an ultrathick film is not carried out as different from the conventional boule method and epitaxial growth is performed with respect to a film thickness that is sufficient to perform slicing into two pieces alone, management of an epitaxial growth surface during epitaxial growth is easy, and a high crystal quality of the epitaxial layer can be readily maintained.

In this case, it is preferable to again use the nitride semiconductor self-supporting substrate manufactured based on the method for manufacturing a nitride semiconductor self-supporting substrate as the seed substrate.

When the nitride semiconductor self-supporting substrate manufactured based on the method for manufacturing a nitride semiconductor self-supporting substrate is again used as the seed substrate in this manner, since the nitride semiconductor self-supporting substrate with a high crystal quality obtained at a low cost is again used as the seed substrate, a manufacturing cost can be held down, and the high-quality nitride semiconductor self-supporting substrate can be obtained.

Furthermore, it is preferable to prepare the plurality of nitride semiconductor self-supporting substrates serving as the seed substrates and simultaneously perform the epitaxial growth with respect to the plurality of seed substrates in the same chamber, and it is particularly preferable to set the number of nitride semiconductor self-supporting substrates serving as the plurality of seed substrates to eight or above.

When the plurality of, especially eight or more nitride semiconductor self-supporting substrates serving as the seed substrates are prepared and epitaxial growth is simultaneously performed with respect to the plurality of seed substrates in the same chamber as explained above, productivity can be considerably improved. Moreover, since epitaxial growth of the ultrathick film is not performed as different from the conventional boule method, management of a gas flow on a growth surface, etc. can be facilitated, and crystallinity of the epitaxial layer can be easily maintained even if epitaxial growth is effected with respect to the plurality of seed substrates in this manner.

Additionally, it is preferable to polish the sliced surface of each epitaxially grown substrate obtained by the slicing into two pieces.

When the sliced surface of the epitaxially grown substrate obtained by slicing into two pieces is polished in this manner, flatness of the nitride semiconductor self-supporting substrate can be improved.

Further, it is preferable to perform the epitaxial growth based on an HVPE method.

When epitaxial growth is effected based on the HVPE method in this manner, epitaxial growth can be carried out at a high speed. Therefore, the nitride semiconductor self-supporting substrate can be manufactured with excellent productivity.

Furthermore, it is preferable to set a thickness of an epitaxial layer formed at the epitaxial growth step to 1 mm or below.

When the thickness of the epitaxial layer formed at the epitaxial growth step is set to 1 mm or below, this thickness is very smaller than a film thickness obtained by the conventional boule method, and hence management of the epitaxial growth surface during epitaxial growth can be facilitated, thereby maintaining a high crystal quality of the epitaxial layer.

Moreover, each of the nitride semiconductor self-supporting substrate serving as the seed substrate and the nitride semiconductor self-supporting substrate to be manufactured can be a GaN self-supporting substrate.

When each of the nitride semiconductor self-supporting substrate serving as the seed substrate and the nitride semiconductor self-supporting substrate to be manufactured is the GaN self-supporting substrate, the GaN self-supporting substrate having a high crystal quality can be manufactured and used for various device applications.

Additionally, it is preferable for the nitride semiconductor self-supporting substrate serving as the seed substrate to have a diameter of 37.5 mm or above, a thickness of 250 μm or above, and a warp value of 35 μm or below.

When the nitride semiconductor self-supporting substrate serving as the seed substrate has a diameter of 37.5 mm or above, a thickness of 250 μm or above, and a warp value of 35 μm or below in this manner, the epitaxial layer can have substantially the same diameter and flatness. As a result, a product obtained from the epitaxial layer side, i.e., the nitride semiconductor self-supporting substrate can be provided as a large-diameter high-quality nitride semiconductor self-supporting substrate having substantially the same diameter and flatness.

Furthermore, it is preferable for the nitride semiconductor self-supporting substrate serving as the seed substrate to have a threading dislocation density of $5 \times 10^7/cm^2$ or below.

When the nitride semiconductor self-supporting substrate serving as the seed substrate has the threading dislocation density of $5 \times 10^7/cm^2$ or below, dislocation of the epitaxial layer can be suppressed to substantially the same extent, and dislocation of the product obtained from the epitaxial layer side, i.e., the nitride semiconductor self-supporting substrate can be also suppressed to substantially the same extent.

Moreover, it is preferable to form a groove along which a tool that is used to slice is guided with chamfering with respect to a peripheral portion of the epitaxially grown substrate after the epitaxial growth step and before the slicing step.

When the groove along which the tool (an inner diameter blade, a wire, etc.) that is used to slice is guided is formed with chamfering with respect to the peripheral portion of the epitaxially grown substrate after the epitaxial growth step and before the slicing step in this manner, breakage or cracks of the-substrate peripheral portion at the slicing step can be avoided, a thickness of the substrate after slicing (a sliced substrate) can be highly accurately controlled, and flatness can be improved.

Additionally, the slicing step can be carried out by using an inner diameter blade having a blade thickness of 250 μm or below, a single-wire saw having a wire diameter of 200 μm or below, or a single-blade saw having a blade thickness of 250 μm or below.

When the slicing step is effected by using an inner diameter blade or a single-blade saw in this manner, high parallelism can be assured on the sliced surface. Further, when the inner diameter blade or the single-blade saw having a blade thickness of 250 μm or below is used, a slicing removal can be reduced, and a loss of materials can be decreased. Furthermore, when the slicing step is carried out by using the single-wire saw having a wire diameter of 200 μm or below, a slicing removal can be further reduced, and a loss of materials can be further decreased.

Moreover, the slicing step can be carried out by stacking the plurality of epitaxially grown substrates and using a multi-wire saw having a wire diameter of 200 μm or below or a multi-blade saw having a blade thickness of 250 μm or below to simultaneously slice the plurality of stacked epitaxially grown substrates.

When the slicing step is carried out by stacking the plurality of epitaxially grown substrates and simultaneously slicing the plurality of stacked epitaxially grown substrates by using a multi-wire saw having a wire diameter of 200 μm or a multi-blade saw having a blade diameter of 250 μm or below, the plurality of epitaxially grown substrates are simultaneously sliced, thereby improving productivity.

Additionally, the present invention provides a nitride semiconductor self-supporting substrate that is manufactured by any one of the methods for manufacturing a nitride semiconductor single crystal substrate.

When the nitride semiconductor self-supporting substrate that is manufactured by any one of the methods for manufacturing a nitride semiconductor single crystal substrate is provided in this manner, it is a nitride semiconductor self-supporting substrate having a high crystal quality.

In this case, a diameter can be 37.5 mm or above, a thickness can be 250 μm or above, and a warp value can be 35 μm or below.

When the nitride semiconductor self-supporting substrate having the diameter of 37.5 mm or above, the thickness of 250 μm or above, and the warp value of 35 μm or below is provided in this manner, it can be used for various device applications as a large-diameter nitride semiconductor self-supporting substrate having high flatness.

Further, it is preferable for a threading dislocation density to be $5 \times 10^7 / cm^2$ or below.

When the nitride semiconductor self-supporting substrate having the threading dislocation density of $5 \times 10^7 / cm^2$ or below is provided in this manner, it is a nitride semiconductor self-supporting substrate having a sufficiently high crystal quality.

The method for manufacturing a nitride semiconductor self-supporting substrate according to the present invention enables producing a large-diameter nitride semiconductor self-supporting substrate having an excellent crystal quality and small warp with good productivity at a low cost.

BEST MODES FOR CARRYING OUT THE INVENTION

Figure 1:
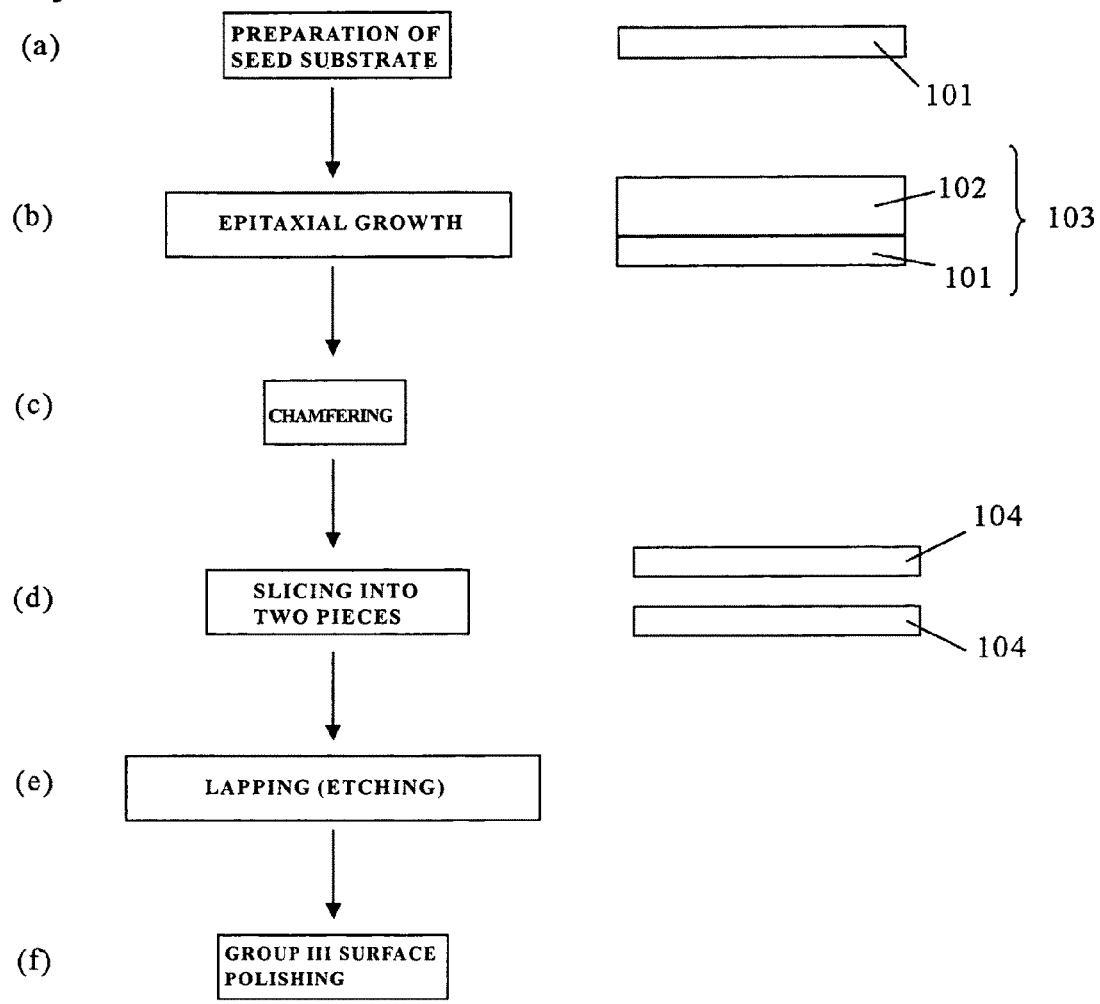
FIG. 1 is a flow sheet showing a manufacturing process of a nitride semiconductor self-supporting substrate according to the present invention.

The present invention will now be explained in more detail hereinafter, but the present invention is not restricted thereto.

As explained above, as a method for manufacturing a GaN self-supporting substrate, a method for forming a mask on, e.g., a GaAs substrate to perform lateral epitaxial growth has a problem that a very complicated process is required, and the very complicated process is used, which leads to a high cost. Further, like this technique, when growing GaN on a different type of substrate based on, e.g., an HVPE method, large warp is produced in an epitaxially grown substrate due to a difference in lattice constant or a difference in thermal expansion coefficient between a seed substrate and an epitaxial layer, the large warp remains in a product, i.e., the GaN self-supporting substrate even after the substrate is removed by liftoff, and remedying this warp at subsequent processing steps is very difficult, which is a problem in a device manufacturing process.

On the other hand, the boule method has an advantage that a GaN single crystal can be used for a substrate, for example. However, when effecting thick epitaxial growth, adhesion of a foreign particle to an epitaxial layer surface results in a large protrusion, and a crystal defect or polycrystal growth occurs at this portion. Setting a growth surface to face downward is advantageous to avoid adhesion of a foreign particle, but a new problem that attachment of the substrate to a holder is difficult arises. Adhesion of a foreign particle that becomes a source for occurrence of a crystal defect as explained above must be prevented for a long time, the epitaxial growth surface must be maintained constant for a long time during epitaxial growth of an ultrathick film that is carried out for a long time, and hence obtaining a high-quality nitride semiconductor self-supporting substrate with good productivity and an excellent yield ratio is very difficult. Further, since fine adjustment is required for management of a gas flow on the growth surface etc., the number of boules that are manufactured in the same chamber (a reaction tube) cannot be increased, whereby productivity cannot be improved.

Thus, the present inventors have keenly conducted experiments and examinations about a method for manufacturing a nitride semiconductor self-supporting substrate with good productivity at a low cost. As a result, they have conceived that nitride semiconductor self-supporting substrates with a high crystal quality that are double the number of seed crystals can be obtained by subjecting a nitride semiconductor self-supporting substrate as a seed substrate to homoepitaxial growth until a prescribed thickness is achieved and slicing an obtained nitride semiconductor epitaxially grown substrate into two pieces. Furthermore, they conceived that the thus manufactured nitride semiconductor self-supporting substrate can be again used as the seed substrate and a cost of an entire manufacturing cycle can be reduced, thereby bringing the present invention to completion.

Although the present invention can be applied to various kinds of group III nitride semiconductors (a nitride such as aluminum, gallium, or indium as a group III metal, or a mixed crystal of these), an example of manufacturing a GaN self-supporting substrate will be mainly explained hereinafter.

FIG. 1 is a flow sheet showing an example of a method for manufacturing a nitride semiconductor self-supporting substrate according to the present invention.

First, a nitride semiconductor self-supporting substrate is prepared as a seed substrate 101 (Step a).

This type of substrate 101 is the same as a nitride semiconductor self-supporting substrate that is finally produced. As the nitride semiconductor self-supporting substrate serving as the seed substrate, one manufactured by any manufacturing method can be used, and a nitride semiconductor self-supporting substrate manufactured by a manufacturing method disclosed in, e.g., Japanese Patent Application Laid-open No. 2000-12900 or Japanese Patent Application Laid-open No. 2000-22212 can be adopted. However, using a nitride semiconductor self-supporting substrate satisfying the following conditions is preferable.

First, a lower threading dislocation density is preferable, $5 \times 10^7/cm^2$ or below is more preferable, and $1 \times 10^7/cm^2$ or below is further preferable. The present invention concerns homoepitaxial growth of growing the same type of nitride semiconductor on a seed substrate, an epitaxial layer is affected by a crystal quality of the seed substrate, and hence using a seed crystal having a low threading dislocation density is preferable.

Further, as a diameter of the seed crystal, 37.5 mm (1.5 inches) or above is preferable, and 50 mm (2 inches) or above is more preferable. To industrially manufacture a device such as an LED at a low cost, a substrate having a larger substrate area is good. Furthermore, a size of a finally manufactured nitride semiconductor self-supporting substrate is affected by a size of the seed substrate. Therefore, the seed substrate having such a large diameter is utilized.

Moreover, as a warp value when converted to a diameter of 50 mm (2 inches), 35 μm or below is preferable. Since the present invention relates to homoepitaxy, an epitaxially grown substrate obtained after slicing into two pieces can have substantially the same warp as different from heteroepitaxy, and a finally manufactured nitride semiconductor self-supporting substrate can be suppressed to substantially the same warp. When warp of the substrate can be suppressed small, photolithography or the like in, e.g., a device fabrication process is not obstructed, thereby stably advancing processing.

Additionally, as a thickness, 250 μm or above is preferable. When such a thickness is adopted, strength and resistance to deflection is sufficient, and slicing can be performed while sufficiently maintaining strength on the seed substrate 101 side at a step of slicing into two pieces as later-explained Step d.

Then, the same type of nitride semiconductor as the seed substrate 101 is epitaxially grown to form an epitaxial layer 102 on the seed substrate 101, thereby providing an epitaxially grown substrate 103 (Step b).

Figure 2:
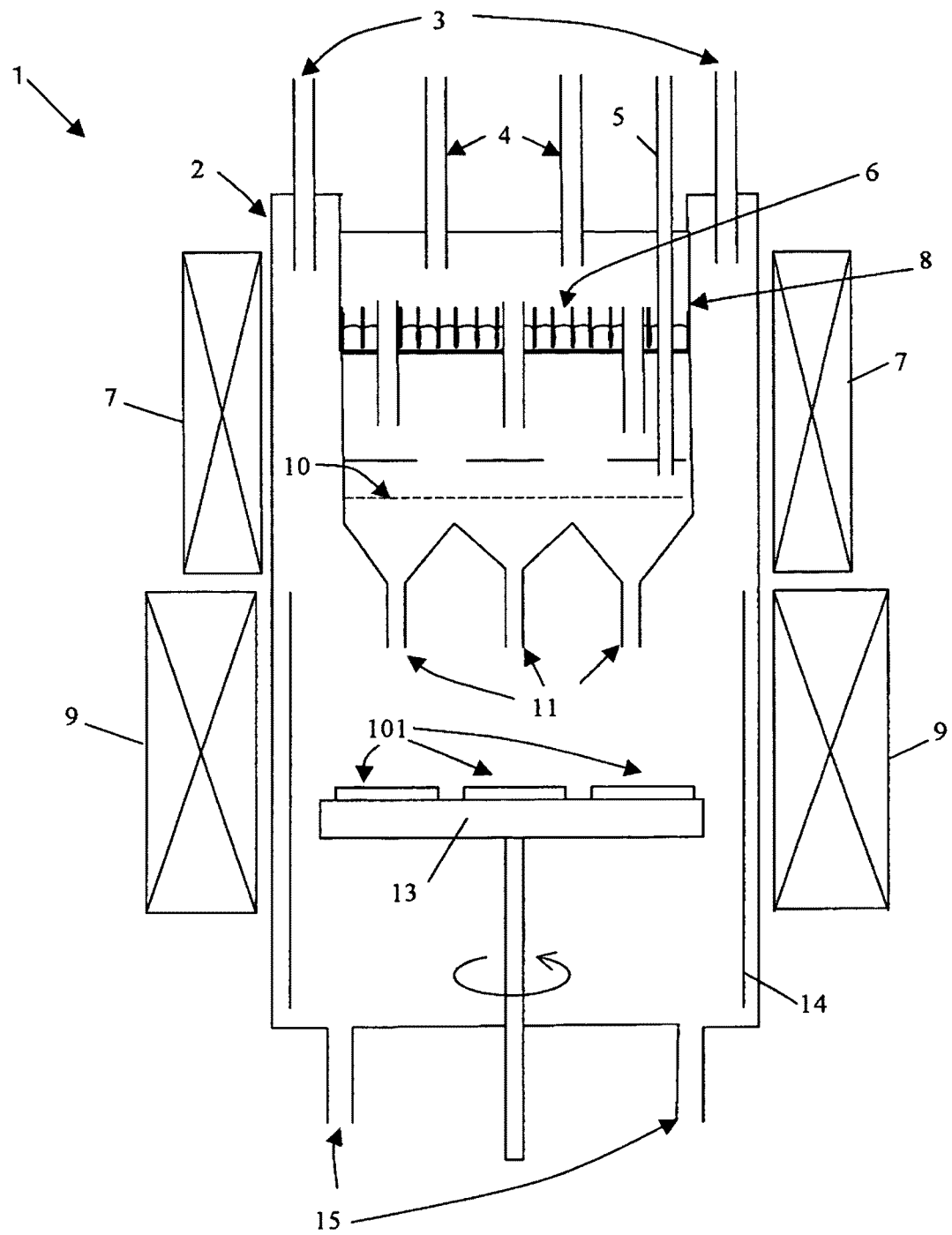
FIG. 2 is a schematic structural view showing an example of a vertical HVPE epitaxial apparatus that can be used in the present invention.

FIG. 2 shows a vertical HVPE apparatus as an example of an epitaxial growth apparatus utilized in the present invention.

An HVPE apparatus 1 includes a group III metal compound generation tube 8 that generates a group III metal compound in a vertical reaction tube (a chamber) 2. The group III metal compound generation tube 8 is configured as follows. It includes a boat for raw material group III metal 6 having a group III metal mounted thereon, a reactive gas introduction tube 4 that introduces, e.g., a hydrogen chloride as a reactive gas and a hydrogen gas as a carrier gas, a gas flow guide plate 10 that adjusts a flow of a generated group III metal compound gas, a dilution gas introduction tube 5 that introduces a dilution gas for adjusting a flow rate of the generated group III metal compound gas, and a group III metal compound blowout tube 11 that blows out the group III metal compound gas. Further, the group III metal compound generation tube 8 is heated by a first heater 7. When manufacturing the nitride semiconductor self-supporting substrate including a plurality of group III metal elements, a ratio of metal mixtures can be adjusted, and these metal elements can be mounted on a boat for raw material group III metal 6.

The HVPE apparatus 1 further includes an ammonia introduction tube 3 that introduces ammonia, a rotatable susceptor 13 on which the seed substrate 101 is mounted, and an inside protection tube 14 that prevents a reactant from being precipitated in the vertical reaction tube 2, a gas exhaust tube 15 from which various kinds of gases are exhausted, a second heater 9 that heats the substrate, and others.

The HVPE apparatus 1 having such a structure is used to perform homoepitaxial growth of a nitride semiconductor as follows.

First, the first heater 7 heats a raw material III group metal mounted on the boat for raw material group III metal 6 to, e.g., 800 to 850° C. The molten raw material group III metal (e.g., gallium) is sprayed with a reactive gas, e.g., a hydrogen chloride from the reactive gas introduction tube 4 to cause a reaction, thereby generating a group III metal compound gas (a gallium chloride when the III metal is gallium and the reactive gas is a hydrogen chloride).

The generated group III metal compound gas passes through the gas flow guide plate 10 and is blown toward the seed substrate 101 mounted on the rotating susceptor 13 from the group III metal compound blowout tube 11. A flow rate of this group III metal compound gas can be adjusted by controlling a flow rate of a dilution gas (e.g., hydrogen or nitrogen) that is introduced through the dilution gas introduction tube 5. The seed substrate 101 is heated by the second heater 9, the group III metal compound gas and ammonia introduced from the ammonia introduction tube 3 react with each other, and the epitaxial layer 102 of the group III nitride semiconductor is epitaxially grown on the seed substrate 101.

In the method for manufacturing a nitride semiconductor self-supporting substrate according to the present invention, since a fluctuation of an epitaxial growth surface is smaller than that in a boule method, substantially constant conditions can be maintained with respect to a gas flow that is required to supply an epitaxial growth gas, and hence a film thickness distribution is not degraded. A countermeasure that is performed in boule formation, i.e., moving a substrate during epitaxial growth and maintaining a growth interface constant with respect to a gas flow is not required, and hence the method according to the present invention has an advantage that the apparatus is not complicated.

It is desirable to suppress a thickness of the epitaxial layer 102 to a necessary minimum thickness. Although depending on a thickness of the nitride semiconductor self-supporting substrate that is finally obtained from the epitaxial layer 102 side, it is preferable to set this thickness of the epitaxial layer 102 to 1 mm or below at a maximum.

When such a thickness is provided, since the epitaxial layer is grown to reach the necessary minimum thickness alone, the regular HVPE apparatus can be used to perform epitaxial growth in such a manner that a growth surface is not greatly affected by a gas flow (i.e., a radial thickness-distribution of the substrate is not degraded) even if the great many seed crystals 101 are simultaneously brought up, thereby forming a high-quality epitaxial layer with good productivity. In this regard, the method for manufacturing a nitride semiconductor self-supporting substrate according to the present invention is superior to the conventional boule method.

Although epitaxial growth according to the present invention is not restricted to the HVPE method, using the HVPE method enables performing epitaxial growth of a nitride semiconductor at a high speed, e.g., 100 µm per hour in the present invention that must form a nitride semiconductor epitaxial layer having a relatively large thickness, e.g., approximately 1 mm or below, which is preferable.

Moreover, since epitaxial growth of an ultrathick film having a thickness of approximately 1 cm to 10 cm or above does not have to be performed in the present invention as different from the boule method, management of, e.g., a gas flow on the growth surface is easy, a crystal quality of the epitaxial layer can be readily maintained even though epitaxial growth is effected with respect to the plurality of seed crystals as described above. Therefore, the plurality of seed substrates 101 can be prepared, epitaxial growth can be simultaneously effected with respect to the plurality of seed substrates 101 in the same chamber 2, and hence adopting this process enables improving productivity. In particular, the number of substrates that are simultaneously processed may be set to eight or above, simultaneous processing of 20 or more substrates is also possible.

In homoepitaxial growth of GaN, even if the seed substrate 101 having a relatively low dislocation density is used, the dislocation density is increased to approximately $5 \times 10^8/cm^2$ on the initial stage of growth in epitaxial growth based on the current HVPE method, but the dislocation density is lowered as epitaxial growth advances, and the dislocation density becomes $5 \times 10^7/cm^2$ or below on the stage where growth of approximately 400 to 800 µm is achieved. The method for manufacturing a nitride semiconductor self-supporting substrate according to the present invention has an advantage that approximately $5 \times 10^7/cm^2$ or below can be assured as a crystal quality of a product obtained from the epitaxial layer side 102, i.e., the nitride semiconductor self-supporting substrate if a region of approximately 0 to 300 µm as an epitaxial growth thickness where the dislocation density is increased can correspond to a region that is removed as a slicing removal at a later-explained step of slicing into two pieces.

Further, since the nitride semiconductor self-supporting substrate manufactured according to the method of the present invention is produced based on homoepitaxial growth, an inner strain of the epitaxially grown substrate 103 is greatly smaller than that in an example of heteroepitaxial growth. Therefore, curve (warp) of the substrate does not become a problem by managing a V-III ratio (a ratio of a nitrogen atom and a group III metal atom) in epitaxial growth and remedying warp of the seed substrate 101 at the later-explained slicing step.

Subsequently, a groove along which a tool that is used to slice is guided may be formed with chamfering with respect to a peripheral portion of the epitaxially grown substrate 103 (Step c). That is, it is effective to perform chamfering and formation of the groove by using, e.g., a diamond wheel before the step of slicing into two pieces as Step d.

When performing chamfering and formation of the groove in this manner, a substrate outer peripheral surface can be readily formed to be vertical with respect to a slicing direction at the step of slicing into two pieces as Step d, thereby preventing a blade or a wire from deviating from a predetermined sliced surface. As a result, irregularities in thickness or local curve (warp) of the substrate obtained after slicing into two pieces (a sliced substrate) can be further reduced. Furthermore, the substrate is demanded to have predetermined shape and diameter, breakage or cracks are avoided at the outer peripheral portion during processing of the nitride semiconductor self-supporting substrate after end of slicing. Specifically, for example, it is preferable to form such a chamfered portion 103a and a groove 103b as depicted in FIG. 3(b) at the peripheral portion of the epitaxially grown substrate 103 immediately after epitaxial growth having such a shape as shown in FIG. 3(a), thereby forming a W-like shape as a whole. If such a chamfered shape is provided, each of two nitride semiconductor self-supporting substrates 104 can have a chamfered shape after slicing the substrate into two pieces at Step d, as shown in FIG. 3(c), and breakage or cracks can be avoided at the outer peripheral portion during processing of each nitride semiconductor self-supporting substrate 104 after end of slicing. It is to be noted that chamfering may be further performed after the slicing step.

The epitaxially grown substrate 103 subjected to the epitaxial growth is sliced into two pieces in parallel to the epitaxial growth surface, thus obtaining two nitride semiconductor self-supporting substrates (sliced substrates) 104 (Step d).

Figure 4:
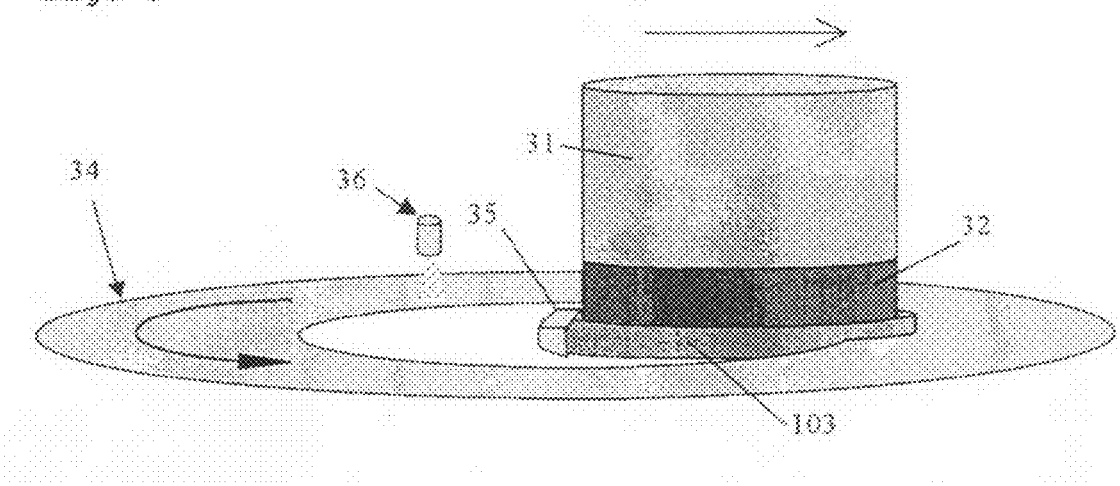
FIG. 4 is a schematic explanatory view showing how the epitaxially grown substrate is sliced into two pieces by using an inner diameter blade.
Figure 6:
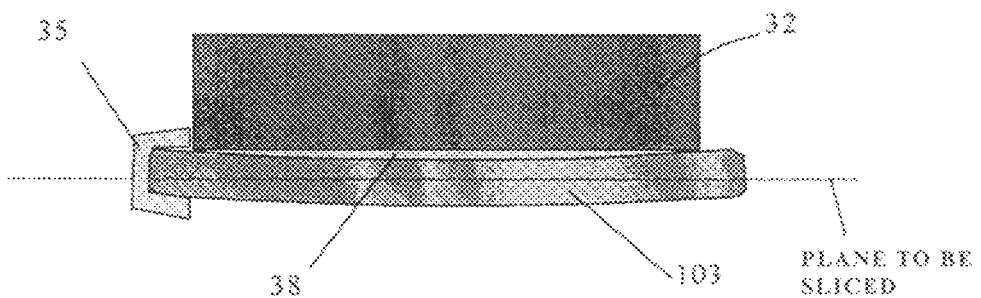
FIG. 6 is a schematic cross-sectional view showing how the epitaxially grown substrate is bonded to a wafer chuck when the epitaxially grown substrate has warp.

This slicing the substrate into two pieces can be carried out by using, e.g., such an inner diameter blade 34 having a diamond electrodeposited thereon as shown in FIG. 4. First, the epitaxially grown substrate 103 is adsorbed (bonded) to an ingot holder 31 through a wafer stage 32. As adsorption (bonding) of this epitaxially grown substrate 103 to the wafer stage 32, various methods such as a vacuum chuck can be used, and appropriately selecting a method can suffice, but bonding the epitaxially grown substrate 103 to the wafer stage 32 via such wax 38 as shown in FIG. 6 enables preventing the substrate from being damaged due to small warp if the epitaxially grown substrate 103 has small warp. It is to be noted that a sliced surface does not have to be matched with a wafer shape, and effecting horizontal slicing can suffice.

Furthermore, it is desirable to bond a back-plate 35 to the substrate to prevent the substrate from breaking in the last half of slicing. It is preferable to attach this back-plate 35 to an orientation flat side and start slicing from an opposite side. As the inner diameter blade 34 at this time, using a very thin blade (a blade thickness is, e.g., 250 µm or below) so that a tensile force of the blade that can assure parallelism can be secured enables reducing a slicing removal (a kerf loss) to also decrease an epitaxial growth thickness and also reduce a loss of materials. Moreover, a cutting coolant is supplied from cutting coolant supplying means 36 to a slicing portion of the inner diameter blade 34 during slicing.

Figure 5:
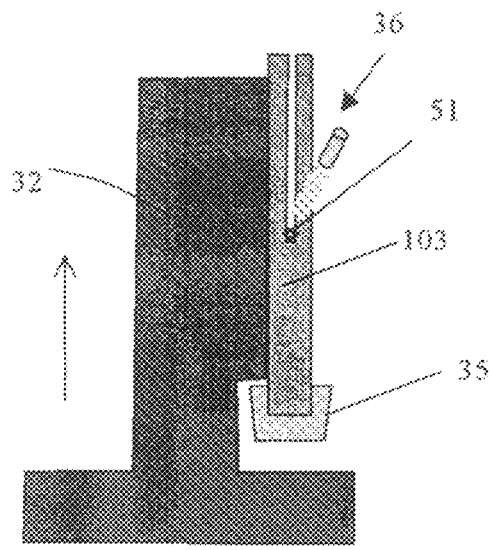
FIG. 5 is a schematic explanatory view showing how the epitaxially grown substrate is sliced into two pieces by using a wire saw.

Additionally, the above-explained slicing the substrate into two pieces can be performed as follows by using, e.g., a wire saw 51 having a diamond electrodeposited thereon as shown in FIG. 5. First, the substrate is bonded (adsorbed) to the wafer stage 32 through, e.g., wax, and the back-plate 35 is disposed to the orientation flat side. Further, the epitaxially grown substrate 103 is sliced into two pieces while supplying a cutting coolant to the wire saw 51 from the cutting coolant supplying means 36.

According to this method, since the wire is generally thinner than a thickness of the inner diameter slicer, a cutting removal based on slicing can be reduced to decrease a loss of materials. Incidentally, using a thin wire so that a tensile force of the wire that can assure parallelism in slicing can be secured and maintained is preferable like the example of the inner diameter blade, and setting a diameter of the wire to, e.g., 200 µm or below is preferable.

Furthermore, the slicing can be performed by stacking the plurality of epitaxially grown substrates 103 and simultaneously slicing the plurality of stacked epitaxially grown substrates 103 by a multi-wire saw having a plurality of wires or a multi-blade saw having a plurality of blades. According to this method, since the plurality of epitaxially grown substrates 103 are simultaneously sliced, productivity can be improved.

At the step of slicing into two pieces, it is preferable for a region in the epitaxially grown substrate 103 removed by slicing to be a region immediately above the seed substrate 101 of the epitaxial layer 102. This region is a region having a relatively high dislocation density than those of upper and lower regions thereof and, in homoepitaxial growth of GaN, a dislocation density is increased to approximately $5 \times 10^8/\text{cm}^2$ on the initial stage of growth in epitaxial growth based on the current HVPE method even if the seed substrate 101 having a relatively low dislocation density is used, but the dislocation density is reduced as epitaxial growth advances, and the dislocation density becomes $5 \times 10^7/\text{cm}^2$ or below on the stage that growth of approximately 400 to 800 µm is achieved. Therefore, the dislocation density of the nitride semiconductor self-supporting substrate obtained from the epitaxial layer 102 side can be reduced by setting a region where the dislocation density is increased to correspond to a region that is removed at the step of slicing into two pieces and determining this region as a removed region. Moreover, adopting this method enables obtaining the seed substrate having an original thickness even after the step of slicing into two pieces.

Additionally, when displacement of the blade or the wire at the time of the step of slicing into two pieces is managed to reduce local curve (warp) of the sliced surface, a subsequent device fabrication process can stably advance. In the present invention, since the epitaxial layer is grown on the same type of seed crystal based on homoepitaxial growth, warp can be greatly reduced as compared with an example where an epitaxial layer of a nitride semiconductor is grown on a different type of seed substrate based on heteroepitaxial growth. Although warp caused due to displacement of the blade or the wire at the time of slicing remains, a size of this warp can be controlled to 35 µm or below or 20 µm or below in particular in case of a 2-inch substrate (a diameter: 50 mm).

Since the sliced surface of the sliced substrate 104 has a damaged layer after the slicing step (Step d), this surface is lapped to improve flatness, and a thickness of the sliced substrate 104 is set to a predetermined surface. At this step, adopting a technique of gradually reducing sizes of lapping abrasive grains of a slurry to shallow the damaged layer is good. Subsequently, the sliced substrate 104 may be etched based on, e.g., thermal KOH to remove the damaged layer (Step e).

Figure 7:
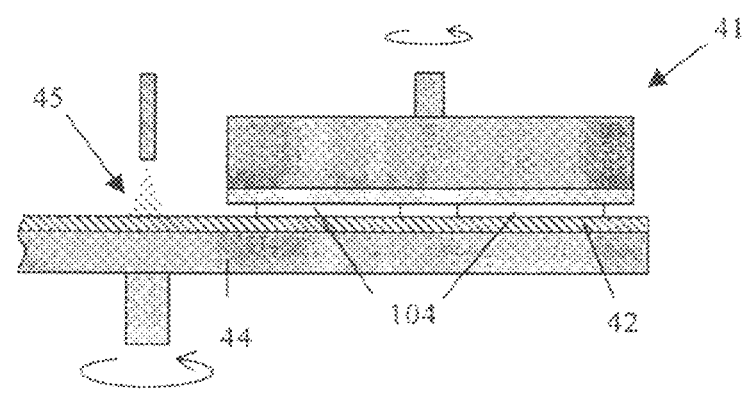
FIG. 7 is a schematic view showing a state of mechanical polishing (mechano-chemical polishing) that can be performed after the step of slicing into two pieces.

At the lapping step, polishing is effected by using such a polishing apparatus as shown in FIG. 7. A surface of the sliced substrate 104 on the opposite side of the slice surface is adsorbed to a rotatable polishing head 41, a sliced surface of the sliced substrate 104 is pressed against a polishing pad 42 attached to an upper side of a rotatable turn table 44 while supplying a slurry 45, and both the polishing head 41 and the turn table 44 are rotated to perform polishing.

Then, the surface where epitaxial growth is effected, i.e., the group III surface (a (0001) surface) side is determined as a polishing target surface, and this surface is polished by the same apparatus as that in the lapping step, e.g., such a polishing apparatus as depicted in FIG. 7. At this step, pH or the like of the slurry is adjusted, and a damaged layer on the surface is removed by mechano-chemical polishing (Step f).

Figure 8:
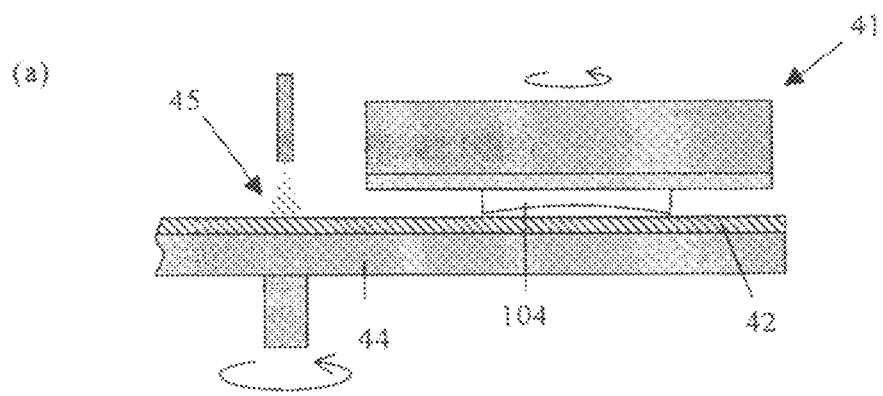
FIG. 8 are schematic views showing a state of mechanical polishing that can be effected after the step of slicing into two pieces, in which (a) shows a case where a sliced surface becomes concave at the time of slicing into two pieces and (b) shows a case where the sliced surface becomes convex at the time of slicing into two pieces.
Figure 8:
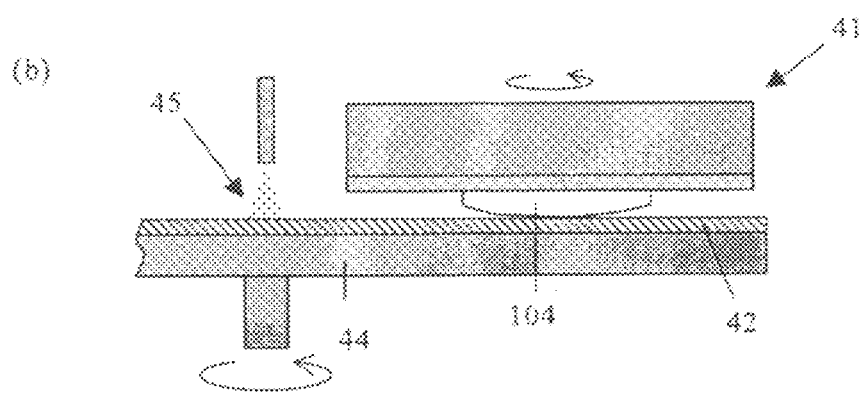

Further, when the seed substrate 101 has large warp, warp of the epitaxially grown substrate 103 after epitaxial growth becomes large. In this case, as shown in FIG. 6, the epitaxially grown substrate is attached to the wafer stage 32 by using wax to be sliced without remedying warp, then the sliced surface side is pressure-bonded to the polishing head 41, and lapping is effected as shown in FIGS. 8(a) and 8(b), thereby correcting warp.

When the above-explained polishing is performed, the damaged layer on the sliced surface is removed, and the nitride semiconductor self-supporting substrate having high flatness can be obtained.

It is to be noted that the damaged layer may be also removed based on various kinds of etching besides the polishing.

Further, a diameter of the nitride semiconductor self-supporting substrate 104 manufactured based on the above-explained steps is equal to that of the seed substrate 101. Furthermore, since the new nitride semiconductor self-supporting substrate is manufactured from the epitaxial layer 102 formed based on homoepitaxial growth, a lattice constant of the epitaxial layer 102 is equal to that of the seed substrate 101, the seed substrate 101 has excellent crystallinity, and the epitaxial layer having less strains or a small dislocation density can be grown by performing appropriate epitaxial pre-processing, thereby providing the nitride semiconductor self-supporting substrate as a product. When the seed substrate 101 having a threading dislocation density of $5 \times 10^7/\text{cm}^2$ or below is used, the nitride semiconductor self-supporting substrate 104 as a product having a threading dislocation density of $5 \times 10^7/\text{cm}^2$ or below can be obtained, thereby acquiring the nitride semiconductor self-supporting substrate that is excellent as a device material substrate for, e.g., a light emitting diode, a laser diode, or an electronic device. It is to be noted that, when the seed substrate 101 having a threading dislocation density of $1 \times 10^7/\text{cm}^2$ or below is used, the nitride semiconductor self-supporting substrate 104 as a product having a threading dislocation density of $1 \times 10^7/\text{cm}^2$ or below can be obtained.

Moreover, when the seed substrate 101 having a diameter of 37.5 mm (1.5 inches) or above is used, the nitride semiconductor self-supporting substrate 104 as a product having a diameter of 37.5 mm or above can be obtained.

Additionally, considering strength or resistance against distortion, it is preferable for the nitride semiconductor self-supporting substrate 104 as a product to be a nitride semiconductor self-supporting substrate having a thickness of 250 μm or above, and it is good enough to adjust the thickness of the epitaxial layer 102 at the epitaxial growth step as Step b while considering a slicing removal at the step of slicing into two pieces as Step d to obtain such a thickness. For example, when using a multi-wire saw utilizing a wire having a diameter of 200 μm to perform slicing at the step of slicing into two pieces as Step d, a slicing removal and a stock removal at Step e can be estimated as approximately 300 μm in total, and the thickness of the epitaxial layer 102 can be set to 550 μm or above. However, it is desirable to set the thickness of the epitaxial layer 102 to 1 mm or below as explained above.

This nitride semiconductor self-supporting substrate 104 as a product can be fed to a device fabrication process (e.g., an MOCVD process for manufacturing an LED or an LD), but it can be again used as a seed substrate at Step a. Since manufacture of the nitride semiconductor self-supporting substrate according to the present invention can be carried out at a low cost as explained above, again using the nitride semiconductor self-supporting substrate 104 as a seed substrate enables reducing a cost of an entire manufacturing cycle, which is preferable.

According to a conventional method for manufacturing a thick-film epitaxial substrate of a nitride semiconductor on a different type of substrate, e.g., a sapphire substrate, an initial substrate can be removed based on laser liftoff or chemical etching to manufacture a nitride semiconductor self-supporting substrate, but the initial substrate is expended. On the other hand, according to the method for manufacturing a nitride semiconductor self-supporting substrate based on homoepitaxial growth according to the present invention, since the initial seed substrate 101 side can be also utilized after slicing into two pieces, suppression of wastefulness can be achieved even if a slicing removal is taken into consideration.

The present invention will now be more specifically explained hereinafter based on examples of the present invention, but the present invention is not restricted thereto.

Example 1

A GaN self-supporting substrate was manufactured as follows based on the method depicted in FIG. 1.

As seed substrates 101, eight GaN self-supporting substrates having a diameter of 50.8 mm (2 inches), a thickness of 400 μm, and a dislocation density of $1 \times 10^7/cm^2$ or below were prepared (Step a), the dislocation density being obtained when a (0001) gallium surface is polished to have an epitaxial growth quality.

Then, such an epitaxial growth apparatus 1 as depicted in FIG. 2 was used to perform epitaxial growth of GaN as follows (Step b).

In a vertical chamber (a reaction tube made of quartz) 2 having an internal diameter of 200 mm, the eight seed substrates were mounted on a susceptor 13 with each (0001) gallium surface facing an upper side (Step a). Further, a gallium chloride generation tube 8 having 400 g of metal gallium put in a boat for gallium source 6 having partitions provided thereon at intervals of 1 cm was provided. The gallium chloride generation tube 8 was heated to 800° C. by using a first heater 7, and peripheries of the seed substrates 101 mounted on the susceptor 13 were heated to 1030° C. by a second heater 9. A hydrogen chloride was introduced into the gallium chloride generation tube 8 from a hydrogen chloride introduction tube 4 with nitrogen being used as a carrier gas at a hydrogen chloride flow rate of 150 ml/minute and a hydrogen flow rate of 500 ml/minute. Furthermore, nitrogen was introduced from a dilution gas introduction tube 5 to be sprayed toward the seed substrates 101 on the susceptor 13 from four gallium chloride blowout tubes 11 each having an internal diameter of 8 mm at a linear velocity of approximately 30 cm/second.

Ammonia was introduced from an ammonia introduction tube 3 together with nitrogen in the same direction as a supply direction of the gallium chloride gas toward the seed substrates 101. A total pressure in the reaction tube at the time of growth was 100 kPa (1.0 atmospheric pressure), a partial pressure of ammonia was 25 kPa (0.25 atmospheric pressure), and a partial pressure of the gallium chloride was 0.5 kPa.

It is to be noted that the nitrogen gas alone was supplied and then the ammonia gas was supplied to the upper sides of the seed substrates 101, and the gallium chloride was supplied after surfaces were stabilized, thereby starting epitaxial growth.

It is to be noted that, as the susceptor 13, one obtained by coating a substrate formed of carbon with a silicon carbide having a thickness of 100 μm was used. This susceptor 13 was rotated at a rotating speed of 10 rpm to perform epitaxial growth of GaN on the seed substrates 101 for 10 hours. A growth film thickness of an epitaxial layer 102 in each obtained epitaxially grown substrate 103 was 850 μm, precipitation of polycrystal did not occur at a peripheral portion or on a back surface of the susceptor 13, and breakage of the substrates did not occur either. Uniformity of a thickness of each epitaxially grown substrate 103 was within ±5%, and a dislocation density of the surface was $1 \times 10^7/cm^2$.

Figure 3:
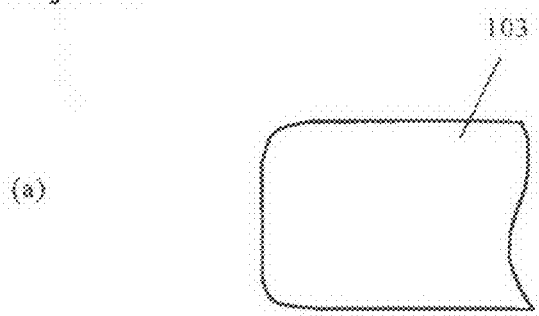
FIG. 3 show schematic cross-sectional views of a substrate before and after a step of slicing into two pieces after epitaxial growth in a method for manufacturing a nitride semiconductor self-supporting substrate according to the present invention, in which (a) is a schematic cross-sectional view showing a peripheral portion of an epitaxially grown substrate before the step of slicing into two pieces, (b) is a schematic cross-sectional view showing a shape of chamfering applied to the peripheral portion of the epitaxially grown substrate before slicing into two pieces, and (c) is a schematic cross-sectional view showing the peripheral portion of the sliced substrate subjected slicing into two pieces.
Figure 3:
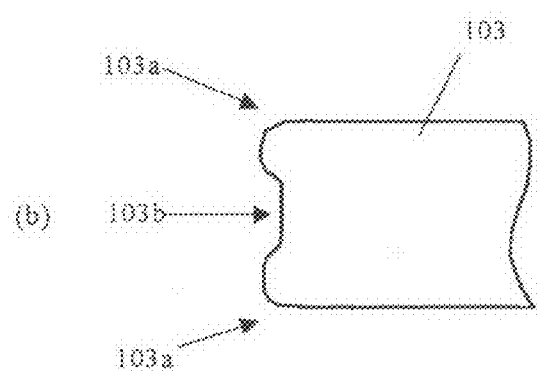
Figure 3:
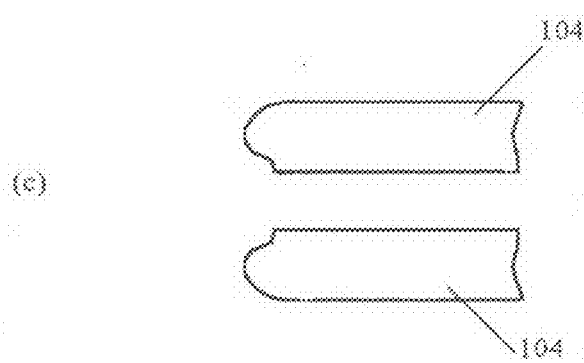

Then, a central position for chamfering was determined by using the back surface of each seed substrate 101 as a reference, and a #1200 diamond grinding stone was utilized to perform such chamfering of a W shape as shown in FIG. 3(*b*) (Step c).

A length of a flat portion of a chamfered portion was set to 500 μm that is obtained by adding 250 μm to a blade thickness of 250 μm as a reference since slicing into two pieces was effected by an inner diameter blade.

Then, as depicted in FIG. 4, the epitaxially grown substrate 103 was attached to an ingot holder 31 through a wafer stage 32, and an inner diameter blade 34 having diamond electrodeposited thereon was used to perform slicing into two pieces (Step d). It is to be noted that the epitaxially grown substrate 103 has warp of approximately 40 to 50 μm, and hence attachment of the epitaxially grown substrate 103 to the wafer stage 32 was performed based on bonding using wax 38 without applying a load. Furthermore, a back-plate 35 was bonded in accordance with each epitaxially grown substrate to prevent the substrate from breaking in the last half of slicing. Slicing was carried out at a slicing speed of 0.2 mm/minute while supplying a cutting coolant.

In this case, a slicing removal in slicing was approximately 300 μm. A thickness of a GaN self-supporting substrate as a product after slicing was within approximately ±40 μm with respect to a target central thickness. The back-plate 35 was removed after end of slicing.

A shape of the chamfered portion of a sliced substrate 104 after slicing was such a shape as shown in FIG. 3(*c*), and it was not a symmetrical shape, but a sufficient effect was recognized in regard to prevention of breakage or cracks at subsequent steps.

Then, a sliced surface of each sliced substrate 104 was polished as follows to remove a damaged layer (Step e), thereby providing mirror-finished gallium surfaces (Step f).

An opposite side of the sliced surface of the sliced substrate 104 was attached to a polishing head 41, the sliced surface was lapped (coarse lapping) with a load of 1.0 kg/cm² by using a diamond slurry having a particle diameter of 15 μm, thereby improving flatness of the sliced substrate 104. Then, a diamond slurry having a particle diameter of 6 μm was utilized to perform lapping (fine lapping) with a load of 2.0 kg/cm². Thereafter, the sliced substrate 104 obtained from the epitaxial layer side was etched based on KOH. The sliced substrate 104 subjected to fine lapping was cleaned, and the gallium surface side was mirror-polished with a load of 2.0 kg/cm² by using a diamond slurry having a particle diameter of 0.1 μm and a suede type polishing pad. Moreover, to remove latent scratches or crystal strains remaining on the sliced surface, a surface layer was etched based on reactive ion etching (RIE) after cleaning. The sliced substrate was set on a silicon wafer having a thick oxide film formed thereon in a commercially available apparatus, and a helium-based chlorine gas was used to effect etching under a 250-W condition.

According to the above-explained method, 16 GaN self-supporting substrates that are double the eight prepared substrates in number were obtained. In all the GaN self-supporting substrates, each substrate had a substantially circular shape with a diameter of 50.8 mm, a thickness of approximately 400 μm, and a warp value of 25 μm or below. Additionally, a dislocation density of the surface was $5\times10^7/cm^2$ or below, a full width at half maximum (FWHM) fell within the range of 170 to 260 arcsec in measurement of a rocking curve of an X ray, thus providing a very high quality.

Example 2

Eight in the 16 GaN self-supporting substrates obtained in Example 1 were again used as seed substrates 101 to manufacture GaN self-supporting substrates as follows.

Each of the eight seed substrates 101 was a GaN self-supporting substrate having a diameter of 50.8 mm, a thickness of approximately 400 μm, a warp value of 25 μm or below, and a threading dislocation density of $5\times10^7/cm^2$ or below as explained above (Step a).

Then, an HPVE apparatus 1 was used like Example 1 to perform growth wherein a growth time was set to 7 hours and 30 minutes (Step b). A thickness of an epitaxial layer 102 was 610 μm.

Subsequently, a chamfering step (Step c) was carried out with respect to an epitaxially grown substrate 103 like Example 1.

Then, a back-plate 35 was attached to an orientation flat portion with respect to the chamfered epitaxially grown substrate 103, and this substrate was set on a wafer stage 32 of such a wire saw as depicted in FIG. 5. Positional setting of the wafer stage 32 was carried out by confirming whether a silicon wafer on the wafer stage 32 side can be sliced in parallel to have a predetermined width when the silicon wafer is sliced before slicing the epitaxially grown substrate 103.

In slicing of the epitaxially grown substrate 103, the seed substrate 101 side was pressure-bonded to the wafer stage 32. As a wire, a wire that has diamond of 20 μm electrodeposited thereon and has a diameter of 130 μm was utilized. Slicing was performed at a workpiece feed rate of 2 mm/hour (Step d). The epitaxially grown substrate 103 was sliced into two pieces, and then the back-plate 35 was removed. A thickness of a sliced substrate on the wafer stage 32 side (a sliced substrate obtained from the epitaxial layer 102 side) was 420±10 μm, and a slicing removal at this moment was approximately 160 μm. After slicing, a sliced surface side was chamfered.

Then, the sliced substrate 104 was subjected to coarse lapping and fine lapping and then to etching based on KOH like Example 1. However, in this example, since unevenness in thickness of the sliced substrate was small, coarse lapping was effected with a load of 2.0 kg/cm², and a lapping time was set to a short time. Subsequently, the sliced substrate 104 was sufficiently cleaned, mirror polishing was carried out by using diamond abrasive grains of 0.1 μm, the sliced substrate 104 was delaminated from a polishing head, then sufficient cleaning was performed, and a polishing damage was removed based on RIE under the same conditions as those in Example 1. Thereafter, cleaning was again effected, thereby obtaining 16 new GaN self-supporting substrates as products. A dimension and a crystal quality of each of these GaN self-supporting substrates were equal to those in Example 1.

Example 3

Figure 9:
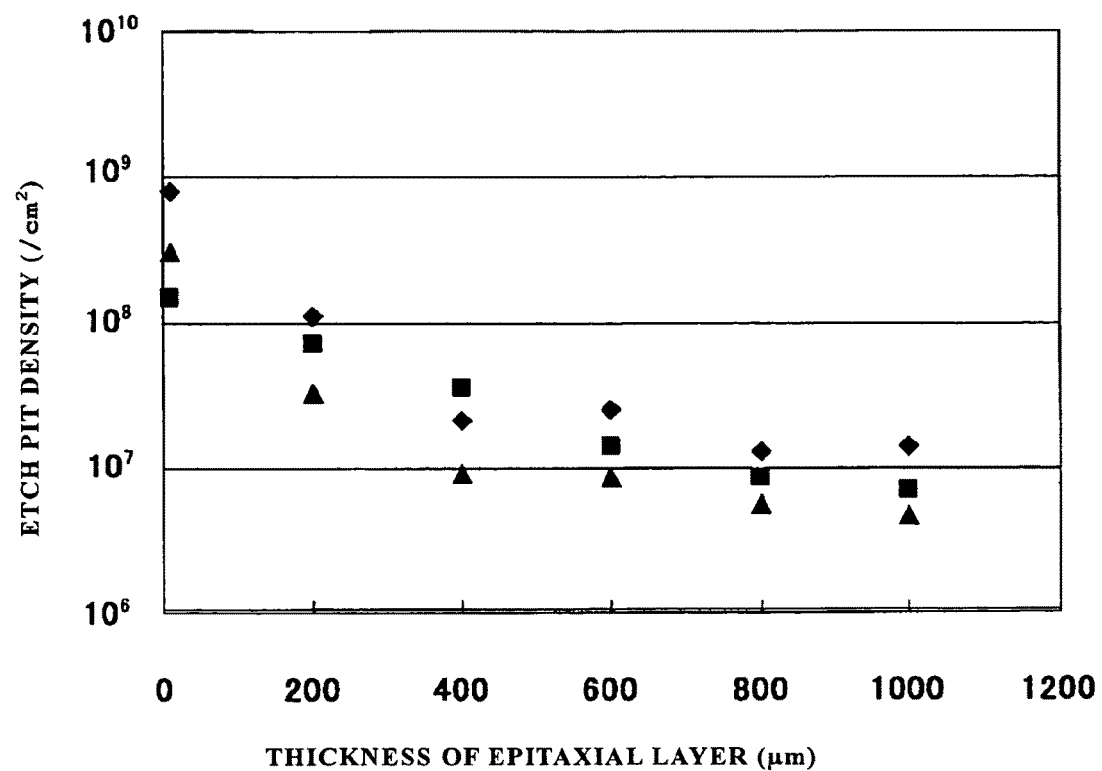
FIG. 9 is a graph showing a relationship between an epitaxial layer thickness and an etch pit density of an epitaxially grown substrate in Example 3.

Like Example 1, steps where epitaxial layers were simultaneously grown to 1 mm (=1000 μm) on three seed substrates 101 each having a threading dislocation density of $1\times10^7/cm^2$ and epitaxially grown substrates 103 were thereby fabricated were carried out from the beginning. The three epitaxially grown substrates 103 were obliquely polished and etched with a solution of potassium hydroxide at a high temperature, and a distribution of a density of etch pits (dislocation pits) in a depth direction was checked. FIG. 9 is a graph showing a relationship between an epitaxial layer thickness and an etch pit density. An epitaxial layer thickness of 0 μm represents an interface between the epitaxial layer and the seed substrate 101 side. The dislocation density was increased beyond a dislocation density of the substrate in single digit or more on the initial stage of epitaxial growth, but it was gradually reduced toward the epitaxial surface to consequently approximate the dislocation density of the seed substrate 101 when epitaxial growth of approximately 400 to 800 μm was effected. Since a portion that has a dislocation density greatly higher than that of the seed substrate 101 and has a thickness close to 0 to 300 μm of an epitaxial layer thickness is removed at a step of slicing into two pieces, it can be understood that a crystal quality of the GaN self-supporting substrate 104 as a product obtained from the epitaxial layer 102 side is substantially equal to that of the seed substrate 101. However, when epitaxial growth was effected to provide a thickness exceeding 1 mm, uniformity of the surface was gradually degraded, and protrusions were produced.

It is to be noted that the present invention is not restricted to the foregoing embodiment. The foregoing embodiment is an exemplification, and any examples that have substantially the same features and demonstrate the same functions and effects as the technical concept explained in claims of the present invention are included in the technical scope of the present invention.

For example, the example where the nitride semiconductor is GaN as a nitride of gallium has been mainly explained above, but the present invention can be applied to a group III nitride semiconductor.

The invention claimed is:

1. A method for manufacturing a nitride semiconductor self-supporting substrate, comprising at least:
    a step of preparing a nitride semiconductor self-supporting substrate serving as a seed substrate, wherein the nitride semiconductor self-supporting substrate consists essentially of nitride semiconductors;
    a step of epitaxially growing the same type of nitride semiconductor as the seed substrate on the seed substrate to produce an epitaxially grown substrate comprising:

a seed substrate portion consisting of the seed substrate, and an epitaxial layer portion consisting of an epitaxial layer formed on the seed substrate portion; and a step of slicing the entire epitaxially grown substrate subjected to the epitaxial growth into only two pieces in parallel to an epitaxial growth surface to produce a first nitride semiconductor self-supporting substrate comprising mainly the seed substrate portion and a second nitride semiconductor self-supporting substrate comprising mainly the epitaxial layer portion, wherein the first nitride semiconductor self-supporting substrate and the second nitride semiconductor self-supporting substrate are manufactured from the single seed substrate, and wherein a thickness of the epitaxial layer formed at the epitaxial growth step is set to 1 mm or below.

2. The method for manufacturing a nitride semiconductor self-supporting substrate according to claim 1, wherein at least one of the first nitride semiconductor self-supporting substrate and the second nitride semiconductor self-supporting substrate is again used as another seed substrate.

3. The method for manufacturing a nitride semiconductor self-supporting substrate according to claim 1, wherein a plurality of the nitride semiconductor self-supporting substrates serving as the seed substrates are prepared, and the epitaxial growth is simultaneously performed with respect to the plurality of seed substrates in a same chamber.

4. The method for manufacturing a nitride semiconductor self-supporting substrate according to claim 2, wherein a plurality of the nitride semiconductor self-supporting substrates serving as the seed substrates are prepared, and the epitaxial growth is simultaneously performed with respect to the plurality of seed substrates in a same chamber.

5. The method for manufacturing a nitride semiconductor self-supporting substrate according to claim 3, wherein the number of nitride semiconductor self-supporting substrates defining the plurality of the nitride semiconductor self-supporting substrates serving as the seed substrates is eight or above.

6. The method for manufacturing a nitride semiconductor self-supporting substrate according to claim 4, wherein the number of nitride semiconductor self-supporting substrates defining the plurality of the nitride semiconductor self-supporting substrates serving as the seed substrates is eight or above.

7. The method for manufacturing a nitride semiconductor self-supporting substrate according to claim 1, wherein the sliced surface of each epitaxially grown substrate obtained by the slicing into two pieces is polished.

8. The method for manufacturing a nitride semiconductor self-supporting substrate according to claim 1, wherein the epitaxial growth is performed based on an HVPE method.

9. The method for manufacturing a nitride semiconductor self-supporting substrate according to claim 1, wherein each of the nitride semiconductor self-supporting substrate serving as the seed substrate and the nitride semiconductor self-supporting substrate to be manufactured is a GaN self-supporting substrate.

10. The method for manufacturing a nitride semiconductor self-supporting substrate according to claim 1, wherein the nitride semiconductor self-supporting substrate serving as the seed substrate has a diameter of 37.5 mm or above, a thickness of 250 μm or above, and a warp value of 35 μm or below.

11. The method for manufacturing a nitride semiconductor self-supporting substrate according to claim 1, wherein the nitride semiconductor self-supporting substrate serving as the seed substrate has a threading dislocation density of $5 \times 10^7$/cm$^2$ or below.

12. The method for manufacturing a nitride semiconductor self-supporting substrate according to claim 1, wherein a groove, along which a tool that is used to slice is guided, is formed, and a peripheral portion of the epitaxially grown substrate away from the groove is shaped via chamfering after the epitaxial growth step and before the slicing step.

13. The method for manufacturing a nitride semiconductor self-supporting substrate according to claim 1, wherein the slicing step is carried out by using an inner diameter blade having a blade thickness of 250 μm or below, a single-wire saw having a wire diameter of 200 μm or below, or a single-blade saw having a blade thickness of 250 μm or below.

14. The method for manufacturing a nitride semiconductor self-supporting substrate according to claim 1, wherein the slicing step is carried out by stacking a plurality of epitaxially grown substrates and using a multi-wire saw having a wire diameter of 200 μm or below or a multi-blade saw having a blade thickness of 250 μm or below to simultaneously slice the plurality of stacked epitaxially grown substrates.

15. A nitride semiconductor self-supporting substrate that is manufactured by the method for manufacturing a nitride semiconductor single crystal substrate according to claim 1.

16. The nitride semiconductor self-supporting substrate according to claim 15, wherein a diameter is 37.5 mm or above, a thickness is 250 μm or above, and a warp value is 35 μm or below.

17. The nitride semiconductor self-supporting substrate according to claim 15, wherein a threading dislocation density is $5 \times 10^7$/cm$^2$ or below.

* * * * *